(12) United States Patent  
Jeong et al.

(10) Patent No.: US 12,199,230 B2  
(45) Date of Patent: Jan. 14, 2025

(54) LIGHT EMITTING DEVICE PACKAGE

(71) Applicant: SAMSUNG ELECTRONICS CO., LTD., Suwon-si (KR)

(72) Inventors: Soonwon Jeong, Hwaseong-si (KR); Yeonjun Sung, Hwaseong-si (KR); Joonwoo Jeon, Seoul (KR); Hanna Heo, Suwon-si (KR); Hyongsik Won, Yongin-si (KR); Sangbok Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 17/669,528

(22) Filed: Feb. 11, 2022

(65) Prior Publication Data

US 2022/0359803 A1 Nov. 10, 2022

(30) Foreign Application Priority Data

May 6, 2021 (KR) .......................... 10-2021-0058531

(51) Int. Cl.
   *H01L 33/62* (2010.01)
   *H01L 33/38* (2010.01)
   *H01L 33/50* (2010.01)
   *H01L 33/56* (2010.01)

(52) U.S. Cl.
   CPC ............ *H01L 33/62* (2013.01); *H01L 33/382* (2013.01); *H01L 33/505* (2013.01); *H01L 33/56* (2013.01)

(58) Field of Classification Search
   CPC ..... H01L 33/62; H01L 33/382; H01L 33/505; H01L 33/56; H01L 33/486; H01L 33/36; H01L 33/52; H01L 33/60; H01L 2933/0091
   See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

| | | |
|---|---|---|
| JP | 2019-067880 A | 4/2019 |
| JP | 2019-114709 A | 7/2019 |

(Continued)

*Primary Examiner* — Mohammad A Rahman  
(74) *Attorney, Agent, or Firm* — Muir Patent Law, PLLC (57) ABSTRACT

A light emitting device package includes a package substrate, a semiconductor light emitting device on the package substrate, the semiconductor light emitting device including a substrate with a light emitting structure, a wavelength conversion portion on the semiconductor light emitting device, the wavelength conversion portion including a first region overlapping the light emitting structure, and a second region other than the first region, an adhesive layer between the semiconductor light emitting device and the wavelength conversion portion, and a reflective resin portion on the package substrate, the reflective resin portion surrounding the semiconductor light emitting device and the wavelength conversion portion, and the reflective resin portion extending to the second region.

20 Claims, 6 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2010/0072486 A1 | 3/2010 | Offermans et al. |
| 2015/0263253 A1 | 9/2015 | Kim et al. |
| 2018/0175265 A1* | 6/2018 | Kim ............... H01L 33/60 |
| 2019/0172983 A1 | 6/2019 | Schricker et al. |

FOREIGN PATENT DOCUMENTS

| | | |
|---|---|---|
| KR | 10-2015-0107480 A | 9/2015 |
| KR | 10-1596001 B1 | 3/2016 |
| KR | 10-2020-0134466 A | 12/2020 |
| WO | WO 2010/001306 A1 | 1/2010 |

* cited by examiner

III-III'

LIGHT EMITTING DEVICE PACKAGE

CROSS-REFERENCE TO RELATED APPLICATION

This application claims benefit of priority to Korean Patent Application No. 10-2021-0058531, filed on May 6, 2021, in the Korean Intellectual Property Office, the disclosure of which is incorporated herein by reference in its entirety.

BACKGROUND

1. Field

Embodiments relate to a light emitting device package.

2. Description of the Related Art

Semiconductor light emitting devices, e.g., semiconductor light emitting diodes (LED) or the like, are known as next-generation light sources that exhibit advantages, e.g., longer lifespan, lower power consumption, faster response speed, environmental friendliness, and the like, as compared to conventional light sources. In particular, the semiconductor light emitting devices are attracting attention as main light sources of various products, e.g., electric devices and lighting devices.

SUMMARY

According to embodiments, a light emitting device package may include a package substrate having wiring layers respectively disposed on an upper surface and a lower surface thereof, a semiconductor light emitting device mounted on the package substrate, a wavelength conversion portion disposed on the semiconductor light emitting device, an adhesive layer interposed between the semiconductor light emitting device and the wavelength conversion portion, and a reflective resin portion disposed on the package substrate to surround the semiconductor light emitting device and the wavelength conversion portion, wherein the semiconductor light emitting device includes: a substrate structure, a light emitting structure disposed on one region of the substrate structure, including a first conductivity-type semiconductor layer, an active layer, and a second conductivity-type semiconductor layer, and having a hole connected to the first conductivity-type semiconductor layer while penetrating through the second conductivity-type semiconductor layer and the active layer, a first electrode disposed between the substrate structure and the light emitting structure, and connected to the first conductivity-type semiconductor layer through the hole, and a second electrode disposed between the substrate structure and the light emitting structure, connected to the second conductivity-type semiconductor layer, and extending to one side of the light emitting structure, wherein the wavelength conversion portion has a first region, overlapping the light emitting structure and a second region, other than the first region, wherein the reflective resin portion extends to the second region.

According to embodiments, a light emitting device package may include a package substrate, a semiconductor light emitting device mounted on the package substrate, and including a substrate structure and a light emitting structure disposed on one region of the substrate structure, and including a first conductivity-type semiconductor layer, and active layer, and a second conductivity-type semiconductor layer, a wavelength conversion portion disposed on the semiconductor light emitting device, an adhesive layer interposed between the semiconductor light emitting device and the wavelength conversion portion, and a reflective resin portion disposed on the package substrate to surround the semiconductor light emitting device and the wavelength conversion portion, wherein the wavelength conversion portion has a first region, overlapping the light emitting structure and a second region, other than the first region, wherein the reflective resin portion extends to the second region to be in contact with a lower surface of the wavelength conversion portion and a side surface of the adhesive layer in the second region.

According to embodiments, a light emitting device package may include a package substrate, a semiconductor light emitting device mounted on the package substrate, and including a substrate structure, in contact with the package substrate and a light emitting structure disposed on one region of the substrate structure, a film-shaped wavelength conversion portion disposed on the semiconductor light emitting device, an adhesive layer interposed between the semiconductor light emitting device and the wavelength conversion portion, and a reflective resin portion disposed on the package substrate to surround the semiconductor light emitting device and the wavelength conversion portion, wherein the semiconductor light emitting device includes, a substrate structure, and a light emitting structure disposed on the substrate structure, and including a first conductivity-type semiconductor layer, an active layer, and a second conductivity-type semiconductor layer, wherein the wavelength conversion portion extends outwardly of the light emitting structure while having a lower surface in contact with the reflective resin portion.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
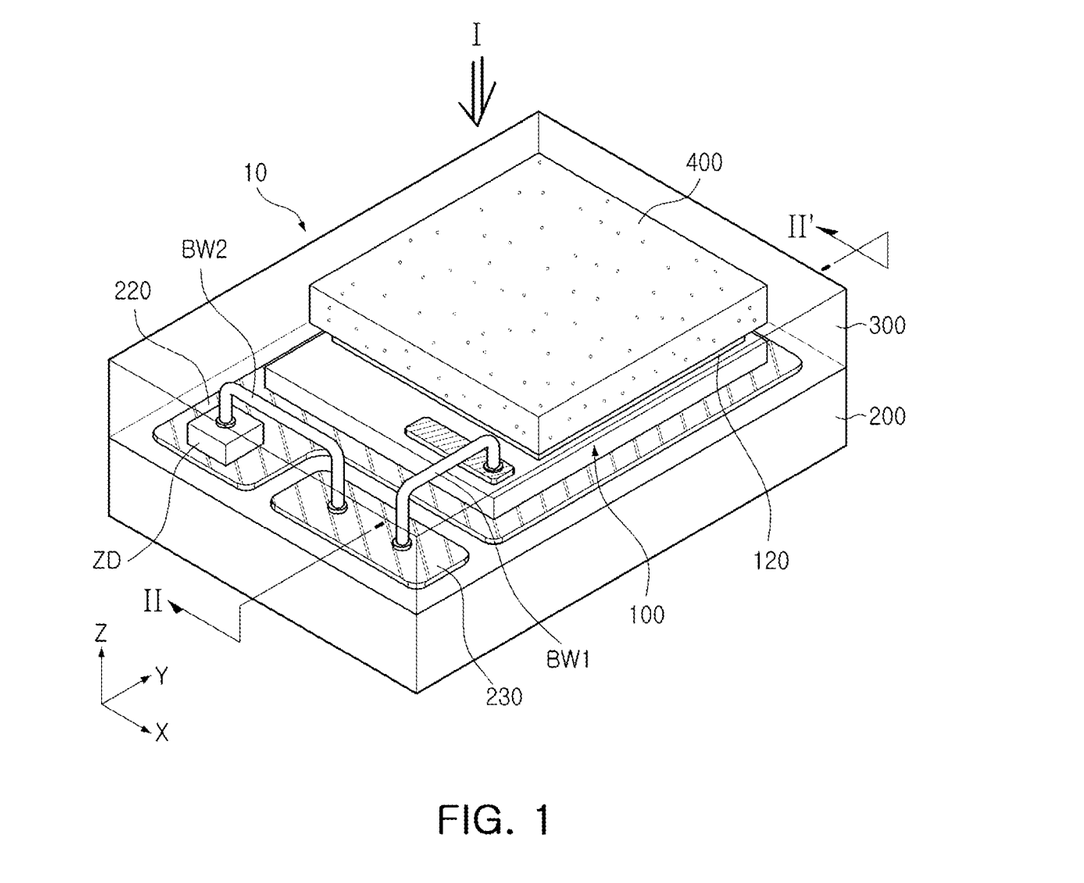
FIG. 1 is a perspective view of a light emitting device package according to an example embodiment.

A light emitting device package according to an example embodiment will be described with reference to FIGS. 1 to 4. FIG. 1 is a perspective view of a light emitting device package according to an example embodiment, FIG. 2 is a plan view of the light emitting device package of FIG. 1, as viewed from direction I in FIG. 1, FIG. 3 is a side cross-sectional view taken along line II-II' of FIG. 1, and FIG. 4 is an enlarged view of part A of FIG. 3.

Referring to FIG. 1, a light emitting device package 10 may include a package substrate 200, a semiconductor light emitting device 100 mounted on the package substrate 200, a wavelength conversion portion 400 disposed on the semiconductor light emitting device 100, and a reflective resin portion 300 disposed to surround the semiconductor light emitting device 100 and the wavelength conversion portion 400. For the convenience of understanding and explanation of each component, the reflective resin portion 300 is shown to be transparent so that an internal configuration is visible, but may be an opaque structure (e.g., a reflective white structure).

Figure 2:
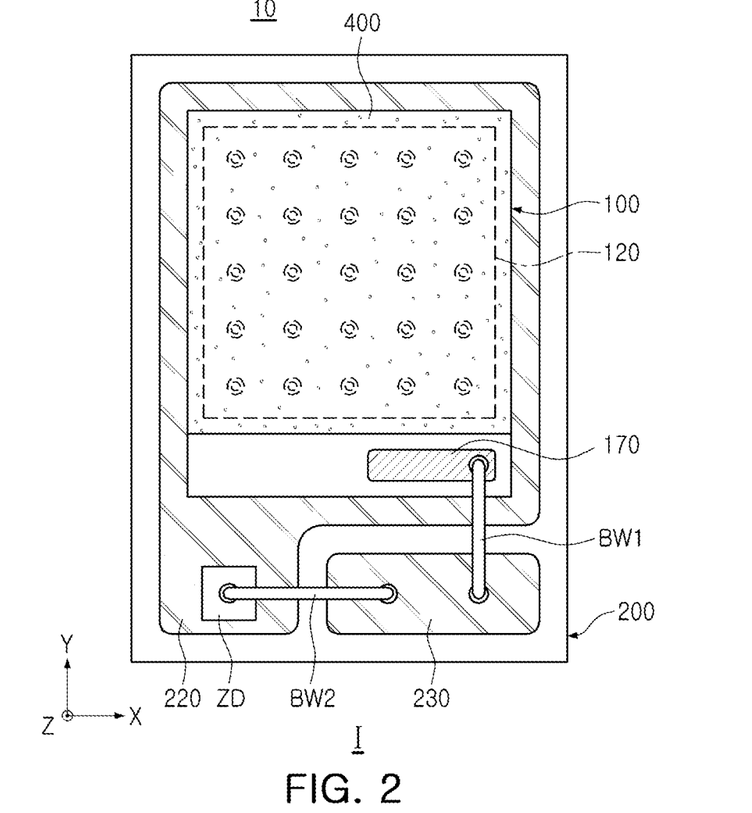
FIG. 2 is a top plan view of the light emitting device package of FIG. 1.
Figure 3:
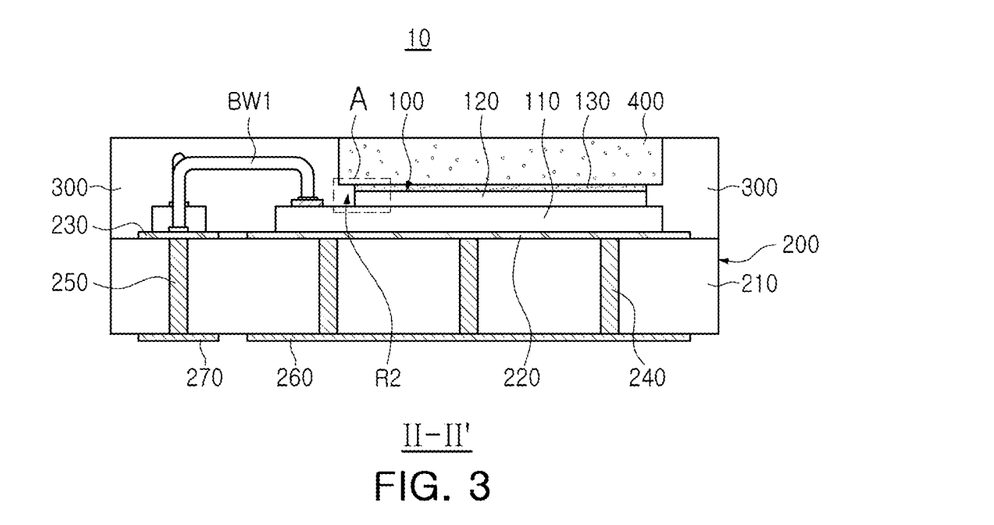
FIG. 3 is a side cross-sectional view taken along line II-IF of FIG. 1.
Figure 4:
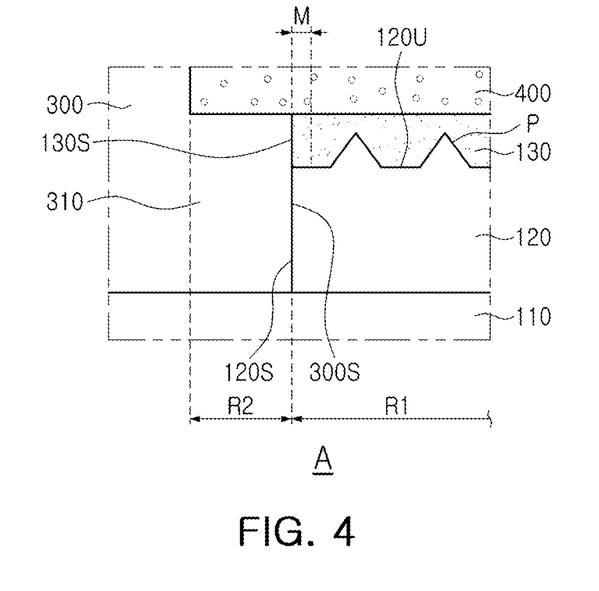
FIG. 4 is an enlarged view of part A of FIG. 3.

Referring to FIGS. 1 to 3, the package substrate 200 may include a body portion 210, first and second upper wiring layers 220 and 230 disposed on an upper surface of the body portion 210, first and second lower wiring layers 260 and 270 disposed on a lower surface of the body portion 210, and first and second through vias 240 and 250 penetrating through the body portion 210.

The package substrate 200 may be electrically connected to the semiconductor light emitting device 100 through the first and second upper wiring layers 220 and 230 and a first bonding wire BW1. The body portion 210 may be a ceramic substrate including, e.g., aluminum nitride (AlN). According to some example embodiments, the package substrate 200 may be a substrate including a lead frame.

The semiconductor light emitting device 100 and a Zener diode ZD may be mounted on the first upper wiring layer 220. The second upper wiring layer 230 and the semiconductor light emitting device 100 may be electrically connected through the first bonding wire BW1. The second upper wiring layer 230 and the Zener diode ZD may be electrically connected through the second bonding wire BW2.

The Zener diode ZD may serve to prevent an overcurrent flowing through the semiconductor light emitting device 100 and/or an applied Electrostatic Discharge (ESD). In addition, in some example embodiments, a device adhesive layer may be disposed between the Zener diode ZD and the first upper wiring layer 220. The device adhesive layer may serve to adhere the Zener diode ZD to the first upper wiring layer 220, and may include a conductive paste or a eutectic metal. In other example embodiments, the light emitting device package 10 may not include a Zener diode ZD, and in this case, the second bonding wire BW2 may also be omitted.

For example, a material of the first and second bonding wires BW1 and BW2 may include at least one of gold (Au), silver (Ag), copper (Cu), lead (Pb), tin (Sn), and aluminum (Al). For example, the first and second bonding wires BW1 and BW2 may be formed by any one of thermo compression bonding and ultrasonic bonding, or a thermo sonic bonding process in which a thermo compression connection method and an ultrasonic bonding method are mixed.

Figure 6:
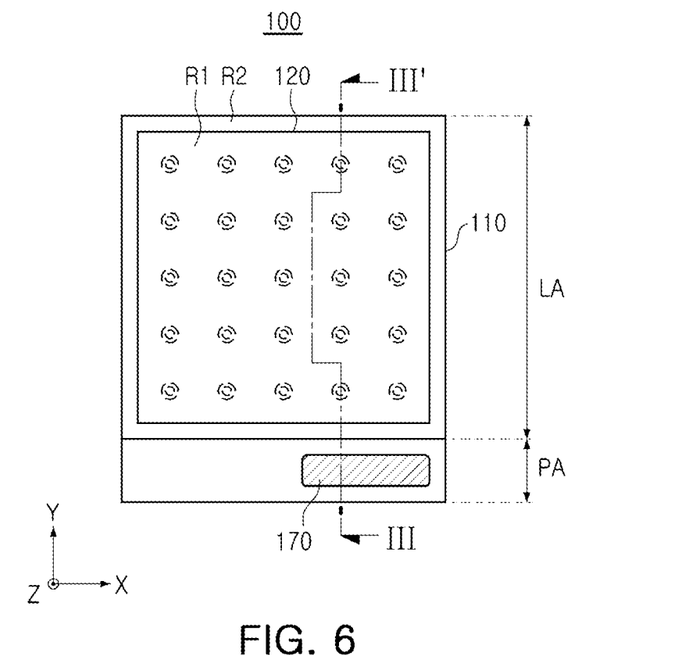
FIGS. 6 and 7 are a plan view and a cross-sectional view, respectively, of a semiconductor light emitting device in a light emitting device package according to an example embodiment.
Figure 7:
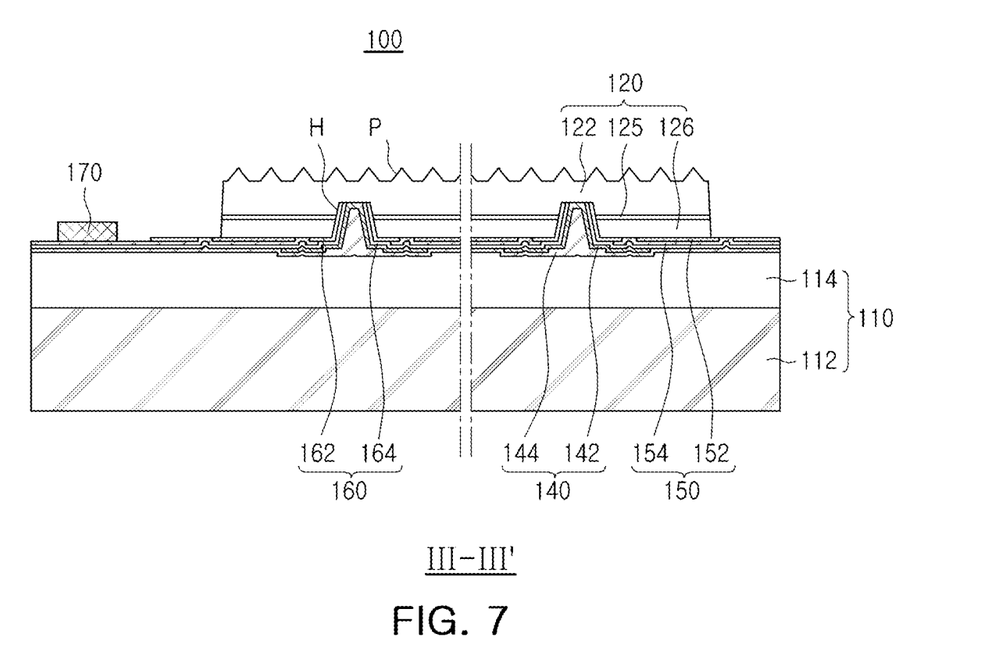

The semiconductor light emitting device 100 may be mounted on the package substrate 200. In an example embodiment, the semiconductor light emitting device 100 may be mounted on the first upper wiring layer 220 of the package substrate 200. A semiconductor light emitting device 100 employable in the light emitting device package 10 will be described with reference to FIGS. 6 and 7. FIGS. 6 and 7 are a plan view and a cross-sectional view of the semiconductor light emitting device 100 in the light emitting device package 10. FIG. 7 illustrates a cross-section along line of FIG. 6.

Referring to FIGS. 6 and 7, the semiconductor light emitting device 100 may include a substrate structure 110 having an upper surface divided into a light emitting area LA and a pad area PA. The semiconductor light emitting device 100 may further include a light emitting structure 120 disposed in the light emitting area LA of the substrate structure 110, a first electrode 140 and a second electrode 150 connected to the light emitting structure 120, an interlayer insulating layer 160 in contact with the first electrode 140 and the second electrode 150, and an electrode pad 170 electrically connected to the second electrode 150 and disposed in the pad area PA.

The substrate structure 110 may be a conductive structure, and may include a support substrate 112 and a bonding metal layer 114, which are vertically stacked. The substrate structure 110 may be connected to the first electrode 140 and may function as an electrode pad, and may be electrically connected to a first conductivity-type semiconductor layer 122. For example, the support substrate 112 may be a conductive substrate including a silicon (Si) substrate, and the bonding metal layer 114 may include, e.g., at least one of gold (Au), tin (Sn), nickel (Ni), Au—Sn, Ni—Sn, or Ni—Au—Sn.

The light emitting structure 120 may include a second conductivity-type semiconductor layer 126, an active layer 124, and the first conductivity-type semiconductor layer 122, sequentially disposed on the substrate structure 110. The light emitting structure 120 may have a plurality of holes H connected to the first conductivity-type semiconductor layer 122 through the second conductivity-type semiconductor layer 126 and the active layer 124. In addition, the light emitting structure 120 may have an uneven portion P on an upper surface of the first conductivity-type semiconductor layer 122 to improve light extraction efficiency. The size and shape of the uneven portion P may be variously changed in some example embodiments.

The first conductivity-type semiconductor layer 122, the active layer 124, and the second conductivity-type semiconductor layer 126 may be formed of a nitride semiconductor, and the light emitting structure 120 may be a nitride light emitting structure. The first conductivity-type semiconductor layer 122 and the second conductivity-type semiconductor layer 126 may be a nitride semiconductor layer having a composition of, e.g., p-type $In_xAl_yGa_{1-x-y}$ ($0 \leq x < 1$, $0 \leq y < 1$, $0 \leq x+y < 1$), respectively. For example, the first conductivity-type semiconductor layer 122 may be an n-type gallium nitride (n-GaN) layer doped with silicon (Si) or carbon (C), and the second conductivity-type semiconductor layer 126 may be a p-type gallium nitride (p-GaN) layer doped with magnesium (Mg) or zinc (Zn). However, in some example embodiments, the first conductivity-type semiconductor layer 122 and the second conductivity-type semiconductor layer 126 may be formed of a semiconductor layer of an aluminum indium gallium phosphide (AlInGaP)-based or an aluminum indium gallium arsenide (AlInGaAs)-based semiconductor layer, in addition to the nitride semiconductor. Each of the first conductivity-type semiconductor layer 122 and the second conductivity-type semiconductor layer 126 may be formed of a single layer, or may also include a plurality of layers having different characteristics, e.g., different doping concentration, different compositions, and the like.

The active layer 124 may emit light having a predetermined energy by recombination of electrons and holes. The active layer 124 may have a single-quantum well (SQW) structure having one quantum well or a multiple-quantum well (MQW) structure in which quantum barrier layers and quantum well layers are alternately disposed. For example, the quantum well layer and the quantum barrier layer may be $In_xAl_yGa_{1-x-y}N$ ($0 \leq x < 1$, $0 \leq y < 1$, $0 \leq x+y \leq 1$) layers having different compositions. For example the quantum well layer and the quantum barrier layer may be a GaN layer or an AlGaN layer.

The first electrode 140 and the second electrode 150 may be disposed below the light emitting structure 120. The first electrode 140 and the second electrode 150 may be electrically connected to the first conductivity-type semiconductor layer 122 and the second conductivity-type semiconductor layer 126, respectively.

The first electrode 140 may include a first contact electrode 142 and a first connection electrode 144. The first contact electrode 142 may be connected to the first conductivity-type semiconductor layer 122 through the plurality of holes H and the first connection electrode 144, which may be disposed on a lower surface of the first contact electrode 142 to connect the first contact electrodes 142 to each other.

The second electrode 150 may include a second contact electrode 152 disposed on a lower surface of the second conductivity-type semiconductor layer 126 and a second connection electrode 154 disposed on a lower surface of the second contact electrode 152 to connect the second contact electrodes 152 to each other. The second electrode 150 may be located between the light emitting structure 120 and the first electrode 140. However, in some example embodiments, the number and dispositional form of layers constituting the first electrode 140 and the second electrode 150 may be variously changed.

The first electrode 140 and the second electrode 150 may extend downwardly of the light emitting structure 120. In the second electrode 150, the second connection electrode 154 may include a region extending outwardly of the light emitting structure 120 to expose an upper surface thereof (left side of FIG. 7). In the region, the second connection electrode 154 may be connected to the electrode pad 170, e.g., the electrode pad 170 may be positioned on an exposed upper surface of the second connection electrode 154. In the case of the first electrode 140, the lower substrate structure 110 may function as an electrode pad. However, in some example embodiments, the number, type, and shape of the electrode pads disposed outwardly of the light emitting structure 120 may be variously changed. For example, in addition to the electrode pad 170 connected to the second electrode 150, an electrode pad connected to the first electrode 140 may further be disposed outside of the light emitting structure 120. In this case, an insulating layer for electrical separation may be further included between the substrate structure 110 and the first electrode 140.

Each of the first electrode 140, the second electrode 150, and the electrode pad 170 may be formed of a single-layer or multi-layer structure of a conductive material. For example, each of the first electrode 140, the second electrode 150, and the electrode pad 170 may include, e.g., independently, at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), and alloys thereof. In some example embodiments, at least one of the first electrode 140 and the second electrode 150 may be a transparent electrode, e.g., formed of a transparent conductive oxide or a transparent conductive nitride, or may also include graphene. For example, the second contact electrode 152 may include at least one of Indium Tin Oxide (ITO), Zinc-doped Indium Tin Oxide (ZITO), Zinc Indium Oxide (ZIO), Gallium Indium Oxide (GIO), Zinc Tin Oxide (ZTO), or FTO. (Fluorine-doped Tin Oxide), AZO (Aluminum-doped Zinc Oxide), GZO (Gallium-doped Zinc Oxide), $In_4Sn_3O_{12}$, and $Zn_{1-x}Mg_xO$(Zinc Magnesium Oxide, $0 \leq x \leq 1$).

The interlayer insulating layer 160 may be disposed to be in contact with the first electrode 140 and/or the second electrode 150. A first interlayer insulating layer 162 may be disposed between the second electrode 150 and the light emitting structure 120, and a second interlayer insulating layer 164 may be disposed between the first electrode 140 and the second electrode 150.

In some example embodiments, at least one of the interlayer insulating layers 160 may be provided as a reflective insulating layer. For example, the reflective insulating layer may have a Distributed Bragg Reflector (DBR) structure in which dielectric layers having different refractive indices are alternately stacked. In addition, according to example embodiments, the semiconductor light emitting device 100 may further include a reflective metal layer disposed on at least one of the interlayer insulating layers 160.

Referring to FIG. 3, the wavelength conversion portion 400 may be disposed on the semiconductor light emitting device 100 inside the reflective resin portion 300. An adhesive layer 130 may be disposed between the wavelength conversion portion 400 and the semiconductor light emitting device 100. The wavelength conversion portion 400 may be configured to convert a wavelength of light emitted from the active layer 124. The wavelength conversion portion 400 may include a wavelength conversion material, e.g., a phosphor or quantum dots, converting the light emitted from the light emitting structure 120 into light having a different wavelength. For example, the wavelength conversion portion 400 may include a green phosphor and a red phosphor to emit white light. The wavelength conversion portion 400 may have a plate shape, e.g., film-shaped. In some example embodiments, the wavelength conversion portion 400 may be formed of a resin containing a wavelength conversion material. For example, the resin may be a silicone resin, an epoxy resin, or a mixed resin thereof. In another example embodiment, the wavelength conversion portion 400 may be provided as a film composed of a ceramic phosphor sintered body.

Referring to FIG. 4, the wavelength conversion portion 400 may include a first region R1 and a second region R2. The first region R1 refers to a region of the wavelength conversion portion 400 that overlaps the light emitting structure 120 of the semiconductor light emitting device 100, e.g., the first region R1 may overlap and cover an entire surface of the light emitting structure 120 that faces the wavelength conversion portion 400. The second region R2 refers to a region of the wavelength conversion portion 400 other than the first region R1, e.g., the second region R2 may be a region that only overhangs the light emitting structure 120 but does not overlap the light emitting structure 120. For example, the second region R2 may extend along an edge of the wavelength conversion portion 400, e.g., be peripheral with respect to the first region R1. For example, the second region R2 may surround, e.g., an entire perimeter of, the first region R1. For example, a portion of the first region R1 of the lower surface of the wavelength conversion portion 400 may be in, e.g., direct, contact with the adhesive layer 130, and a portion of the second region R2 of the lower surface of the wavelength conversion portion 400 may be in, e.g., direct, contact with the reflective resin portion 300. Therefore, the lower surface of the wavelength conversion portion 400, i.e., a surface of the wavelength conversion portion 400 facing the semiconductor light emitting device 100, may be wider than an upper surface 120U of the light emitting structure 120, e.g., in both the X and Y directions. For example, referring to FIG. 1, the lower surface of the wavelength conversion portion 400 may extend beyond, e.g., and overhang, the upper surface 120U of the light emitting structure 120 around an entire perimeter of the light emitting structure 120.

Referring to FIGS. 3 and 4, the reflective resin portion 300 may extend to the second region R2, and may have a protrusion 310 interposed between the wavelength conversion portion 400 and the substrate structure 110 of the semiconductor light emitting device 100. For example, as illustrated in FIG. 4, the protrusion 310 of the reflective resin portion 300 may directly contact the lower surface of the second region R2 of the wavelength conversion portion 400 and the side, e.g., lateral, surfaces of the light emitting structure 120 and the adhesive layer 130 to completely fill a space between the wavelength conversion portion 400 and the substrate structure 110 of the semiconductor light emitting device 100. For example, as illustrated in FIG. 4, the wavelength conversion portion 400 may extend beyond, e.g., and overhang, both the light emitting structure 120 and the adhesive layer 130, with the protrusion 310 filling a space under the overhang. As illustrated in FIG. 4, a side surface 300S of the protrusion 310 is disposed to be in direct contact with the side surface 120S of the light emitting structure 120, so light emitted from the active layer of the light emitting structure 120 may be directly reflected by the reflective resin portion 300 to be emitted through the wavelength conversion portion 400. Accordingly, a decrease in luminous flux due to the adhesive layer 130 may be prevented, and light extraction efficiency and color distribution of the light emitting device package 10 may be further improved.

The adhesive layer 130 may be filled between the wavelength conversion portion 400 and the semiconductor light emitting device 100. The adhesive layer 130 may attach the wavelength conversion portion 400 to the upper surface 120U of the light emitting structure 120, e.g., the adhesive layer 130 may be directly between the lower surface of the first region R1 of the wavelength conversion portion 400 and the upper surface 120U of the light emitting structure 120. For example, the adhesive layer 130 may be a curable resin material, e.g., transparent silicone.

In a process of attaching the wavelength conversion portion 400 to the semiconductor light emitting device 100, by adjusting an amount of an adhesive material applied to form the adhesive layer 130 on the upper surface 120U of the light emitting structure 120, a side surface 130S of the adhesive layer 130 may be substantially coplanar with the side surface 120S of the light emitting structure 120. The side surface 130S of the adhesive layer 130 and the side surface 120S of the light emitting structure 120 do not have to have a perfect coplanar surface, and within a predetermined interval M allowed in the manufacturing process, the side surface 130S of the adhesive layer 130 may also be disposed on the upper surface 120U of the light emitting structure 120. For example, the amount of the adhesive layer 130 may be adjusted, so that the wavelength conversion portion 400 overhangs an outermost side surface of the adhesive layer 130.

Figure 5:
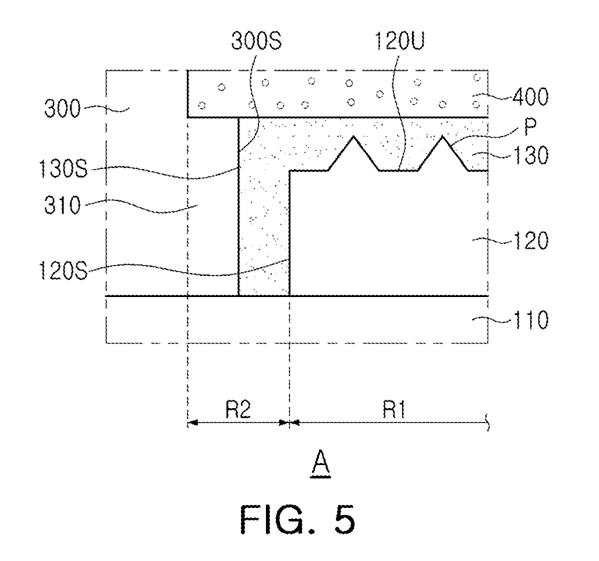
FIG. 5 is a modified example of FIG. 4.

In addition, in some example embodiments, as shown in FIG. 5, while the protrusion of the reflective resin portion 300 is disposed in the second region R2 of the wavelength conversion portion 400, the adhesive layer 130 may be disposed to cover the side surface 120S of the light emitting structure 120. For example, as illustrated in FIG. 5, a portion of the adhesive layer 130 may be disposed in the second region R2 to cover the, e.g., entire, side surface 120S of the light emitting structure 120, e.g., while the wavelength conversion portion 400 still overhangs an outermost side surface of the adhesive layer 130. Accordingly, the side surface 130S of the adhesive layer 130 may be in, e.g., direct, contact with the side surface 300S of the reflective resin portion 300 in the second region R2 of the wavelength conversion portion 400. In this case, compared to the case in which the side surface 120S of the light emitting structure 120 and the side surface 300S of the reflective resin portion 300 are in direct contact, an effect that a decrease in luminous flux by the adhesive layer 130 is prevented may be relatively low, but light extraction efficiency and color distribution may be further improved, as compared to the case in which the protrusion 310 is not formed on the reflective resin portion 300.

Referring to FIGS. 3 and 4, the reflective resin portion 300 may be disposed to encapsulate the semiconductor light emitting device 100 and the wavelength conversion portion 400. The side surface 300S of the reflective resin portion 300 may be in direct contact with the side surface 120S of the semiconductor light emitting device 100 and the side surface 130S of the adhesive layer 130. The protrusion 310 interposed between the wavelength conversion portion 400 of the reflective resin portion 300 and the substrate structure 110 of the semiconductor light emitting device 100 may be in direct contact with the side surface 130S of the adhesive layer 130 and the side surface 120S of the light emitting structure 120. In addition, as shown in FIG. 5, according to example embodiments, the side surface 300S of the reflective resin portion 300 may be in contact with the side surface 130S of the adhesive layer 130 while not directly in contact with the side surface 120S of the light emitting structure 120. The reflective resin portion 300 may include a reflective resin, e.g., a white silicone, and may further include light reflective particles, e.g., $TiO_2$, $Al_2O_3$, and the like, e.g., to improve reflectivity and luminous flux.

In such a light emitting device package 10, the protrusion 310 of the reflective resin portion 300 interposed between the wavelength conversion portion 400 and the substrate structure 110 may prevent or substantially minimize a decrease in a luminous flux by the adhesive layer 130. Further, light extraction efficiency and color distribution of the light emitting device package 10 may be improved.

Figure 8:
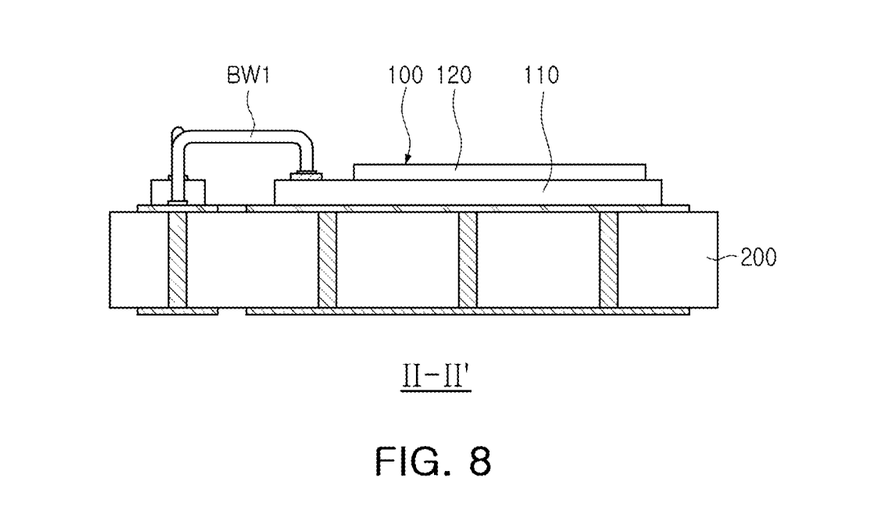
FIGS. 8 to 10 are cross-sectional views of stages in a method of manufacturing a light emitting device package according to an example embodiment.
Figure 9:
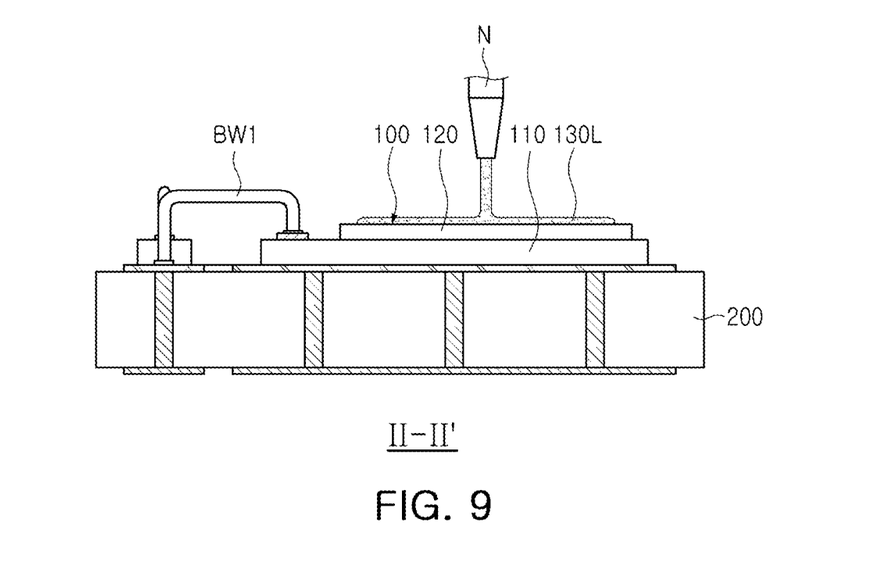
Figure 10:
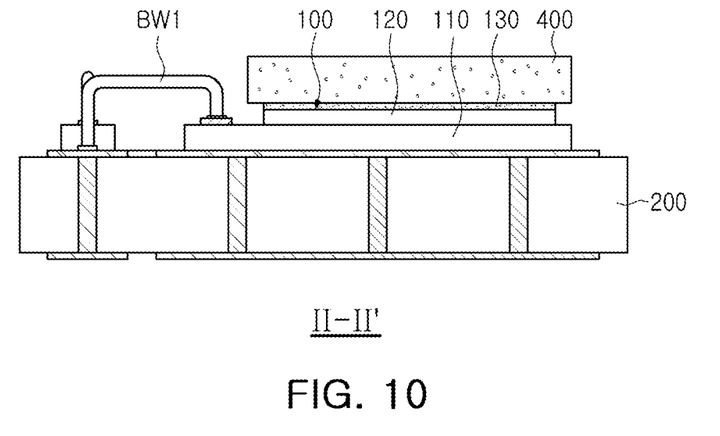

A method of manufacturing the light emitting device package 10 according to an example embodiment will be described with reference to FIGS. 8 to 10. FIGS. 8 to 10 are cross-sectional views of stages in a method of manufacturing the light emitting device package 10.

Referring to FIG. 8, the semiconductor light emitting device 100 may be mounted on the package substrate 200.

For example, a bonding process may be performed so that the semiconductor light emitting device 100 is mounted on the package substrate 200 by a eutectic bonding. In another example, the semiconductor light emitting device 100 may be mounted on the package substrate 200 by a separate solder ball or a bonding layer. Next, the package substrate 200 and the substrate structure 110 of the semiconductor light emitting device 100 may be, e.g., electrically, connected to each other using the first bonding wire BW1.

Referring to FIG. 9, an adhesive material 130L for adhering the wavelength conversion portion 400 (refer to FIG. 10) may be applied to the semiconductor light emitting device 100. The adhesive material 130L may be applied to the upper surface of the light emitting structure 120 through a nozzle N. The adhesive material 130L may form the adhesive layer 130 after curing (refer to FIG. 10).

For example, the adhesive material 130L may be applied in an amount such that it does not flow down to a side surface of the light emitting structure 120 while the wavelength conversion portion 400 is attached thereon (FIG. 4). The amount of the applied adhesive material 130L may be calculated in advance through experimentation. In another example, the amount of the adhesive material 130L may be an amount such that a part of the adhesive material 130L (e.g., a limited amount) covers the side surface of the light emitting structure 120, so that the side surface of the adhesive layer 130 formed by curing the adhesive material 130L is located in the second region R2 of the wavelength conversion portion 400 (FIG. 5).

Referring to FIG. 10, the wavelength conversion portion 400 may be attached to the adhesive layer 130. As described above, the wavelength conversion portion 400 may be attached to the adhesive layer 130, such that the wavelength conversion portion 400 extends beyond the adhesive layer 130, e.g., such that the wavelength conversion portion 400 overlaps the top of the side surface of the adhesive layer 130.

Next, referring to FIGS. 3 and 4, the reflective resin portion 300 surrounding the semiconductor light emitting device 100 and the wavelength conversion portion 400 may be formed. The reflective resin portion 300 may be formed to cover outer side surfaces of the semiconductor light emitting device 100 and the wavelength conversion portion 400. The reflective resin portion 300 may be introduced between the wavelength conversion portion 400 and the substrate structure 110 in a liquid state, and then cured to form the protrusion 310. The reflective resin portion 300 may be formed to encapsulate the upper surface of the package substrate 200 and the first and second bonding wires BW1 and BW2.

By way of summation and review, embodiments provide a light emitting device package having improved light extraction efficiency. That is, according to embodiments, a light emitting device package includes a reflective resin portion with a protrusion in a region between a wavelength conversion layer and a substrate structure, so a light emitting device package having improved light extraction efficiency may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device package, comprising:
a package substrate including wiring layers;
a semiconductor light emitting device on the package substrate, the semiconductor light emitting device including:
a substrate structure,
a light emitting structure on the substrate structure, the light emitting structure having a first conductivity-type semiconductor layer, an active layer, and a second conductivity-type semiconductor layer;
a first electrode between the substrate structure and the light emitting structure, the first electrode being connected to the first conductivity-type semiconductor layer through a hole in the active layer and the second conductivity-type semiconductor layer, and
a second electrode between the substrate structure and the light emitting structure, the second electrode extending to a side of the light emitting structure and being connected to the second conductivity-type semiconductor layer;
a wavelength conversion portion on the semiconductor light emitting device, the wavelength conversion portion including:
a first region overlapping the light emitting structure, and
a second region other than the first region;
an adhesive layer between the semiconductor light emitting device and the wavelength conversion portion; and
a reflective resin portion on the package substrate, the reflective resin portion surrounding the semiconductor light emitting device and the wavelength conversion portion, and the reflective resin portion extending to the second region.

2. The light emitting device package as claimed in claim 1, wherein the reflective resin portion is in contact with a lower surface of the second region of the wavelength conversion portion and with an upper surface of the substrate structure.

3. The light emitting device package as claimed in claim 1, wherein an inner side surface of the reflective resin portion is in contact with a side surface of the light emitting structure and a side surface of the adhesive layer.

4. The light emitting device package as claimed in claim 1, wherein a side surface of the light emitting structure and a side surface of the adhesive layer define a substantially flat coplanar surface.

5. The light emitting device package as claimed in claim 1, wherein the adhesive layer covers a side surface of the light emitting structure.

6. The light emitting device package as claimed in claim 5, wherein an inner side surface of the reflective resin portion is in contact with the side surface of the light emitting structure.

7. The light emitting device package as claimed in claim 1, wherein an upper surface of the light emitting structure has an uneven portion, and the adhesive layer covers the uneven portion.

8. The light emitting device package as claimed in claim 1, wherein an area of a lower surface of the wavelength conversion portion is greater than an area of an upper surface of the light emitting structure.

9. The light emitting device package as claimed in claim 1, wherein a side surface of the adhesive layer is on the second region of the wavelength conversion portion.

10. The light emitting device package as claimed in claim 1, wherein the reflective resin portion includes light reflective particles.

11. The light emitting device package as claimed in claim 1, wherein the second electrode is between the light emitting structure and the first electrode.

12. The light emitting device package as claimed in claim 1, wherein the second electrode includes:
a connection electrode extending to one side of the light emitting structure, and
an electrode pad on the connection electrode.

13. A light emitting device package, comprising:
a package substrate;

a semiconductor light emitting device on the package substrate, the semiconductor light emitting device including a substrate structure and a light emitting structure on the substrate structure, and the light emitting structure having a first conductivity-type semiconductor layer, an active layer, and a second conductivity-type semiconductor layer;

a wavelength conversion portion on the semiconductor light emitting device, the wavelength conversion portion having:
   a first region overlapping the light emitting structure, and
   a second region other than the first region;

an adhesive layer between the semiconductor light emitting device and the wavelength conversion portion; and a reflective resin portion on the package substrate, the reflective resin portion surrounding the semiconductor light emitting device and the wavelength conversion portion, and the reflective resin portion including a protrusion that extends under at least a portion of the second region of the wavelength conversion portion to contact a lower surface of the wavelength conversion portion and a side surface of the adhesive layer, wherein the side surface of the adhesive layer is substantially planar.

14. The light emitting device package as claimed in claim 13, wherein the second region of the wavelength conversion portion surrounds the first region of the wavelength conversion portion.

15. The light emitting device package as claimed in claim 13, wherein the second region of the wavelength conversion portion includes an edge of the wavelength conversion portion.

16. The light emitting device package as claimed in claim 13, wherein an upper surface of the wavelength conversion portion and an upper surface of the reflective resin portion are substantially coplanar.

17. The light emitting device package as claimed in claim 13, wherein the adhesive layer includes a transparent silicone, and the reflective resin portion includes white silicone.

18. The light emitting device package as claimed in claim 13, wherein the reflective resin portion includes light reflective particles.

19. The light emitting device package as claimed in claim 13, wherein the second conductivity-type semiconductor layer, the active layer, and the first conductivity-type semiconductor layer are sequentially stacked on the substrate structure.

20. A light emitting device package, comprising:
a package substrate;
a semiconductor light emitting device on the package substrate, the semiconductor light emitting device including:
   a substrate structure in contact with the package substrate, and
   a light emitting structure on the substrate structure, the light emitting structure having a first conductivity-type semiconductor layer, an active layer, and a second conductivity-type semiconductor layer;
a film-shaped wavelength conversion portion on the semiconductor light emitting device;
an adhesive layer between the semiconductor light emitting device and the wavelength conversion portion; and
a reflective resin portion on the package substrate, the reflective resin portion surrounding the semiconductor light emitting device and the wavelength conversion portion, the wavelength conversion portion extending outwardly of the light emitting structure while having a lower surface in contact with the reflective resin portion, the reflective resin portion contacting a side surface of the adhesive layer under the wavelength conversion portion, wherein the side surface of the adhesive layer is substantially planar.

* * * * *